(12) United States Patent
Golan et al.

(10) Patent No.: US 10,002,649 B1
(45) Date of Patent: Jun. 19, 2018

(54) PRELIMINARY READY INDICATION FOR MEMORY OPERATIONS ON NON-VOLATILE MEMORY

(71) Applicant: SanDisk Technologies LLC, Plano, TX (US)

(72) Inventors: Ronen Golan, Petah-Tikva (IL); Roie Shpaizman, Sede Hemed (IL); Alex Bazarsky, Holon (IL); Eli Elmoalem, Nili (IL); Grishma Shah, Milpitas, CA (US); Idan Alrod, Herzeliya (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/440,975

(22) Filed: Feb. 23, 2017

(51) Int. Cl.
*G11C 7/10* (2006.01)
*G11C 16/32* (2006.01)
*G11C 7/22* (2006.01)

(52) U.S. Cl.
CPC ............ *G11C 7/1063* (2013.01); *G11C 7/22* (2013.01); *G11C 16/32* (2013.01)

(58) Field of Classification Search
CPC . G11C 16/32; G11C 16/3436; G11C 16/3454; G11C 29/50012
See application file for complete search history.

(56) References Cited

U.S. PATENT DOCUMENTS

| | | | |
|---|---|---|---|
| 5,357,622 A | 10/1994 | Parks et al. | |
| 5,432,747 A * | 7/1995 | Fuller | G11C 7/12 365/189.05 |
| 5,652,856 A | 7/1997 | Santeler et al. | |
| 8,441,873 B2 | 5/2013 | Grunzke | |
| 8,484,407 B2 * | 7/2013 | Haukness | G11C 16/32 711/103 |
| 8,582,356 B2 | 11/2013 | Abdulla | |
| 8,750,057 B2 | 6/2014 | Grunzke | |
| 8,755,233 B2 * | 6/2014 | Nagashima | G11C 16/10 365/185.19 |
| 8,804,425 B2 | 8/2014 | Chen et al. | |
| 8,964,498 B2 | 2/2015 | Shin et al. | |
| 9,009,398 B2 | 4/2015 | Avila et al. | |
| 9,424,901 B1 * | 8/2016 | An | G11C 7/227 |
| 2017/0132074 A1 * | 5/2017 | Zhang | G06F 11/1068 |

* cited by examiner

*Primary Examiner* — Vanthu Nguyen
(74) *Attorney, Agent, or Firm* — Kunzler, PC

(57) ABSTRACT

Apparatuses, systems, methods, and computer program products are disclosed for providing a preliminary ready indication for non-volatile memory. A non-volatile memory element initiates a write operation for one or more storage cells of the non-volatile memory element. The non-volatile memory element determines whether a progress threshold is satisfied for the write operation. The non-volatile memory element provides a preliminary ready indication, indicating that the progress threshold is satisfied.

20 Claims, 9 Drawing Sheets

PRELIMINARY READY INDICATION FOR MEMORY OPERATIONS ON NON-VOLATILE MEMORY

TECHNICAL FIELD

The present disclosure, in various embodiments, relates to non-volatile memory and more particularly relates to providing a preliminary ready indication for memory operations on non-volatile memory.

BACKGROUND

Controllers for various types of non-volatile memory devices may schedule storage operations (e.g., read, write, program, and/or erase operations) for multiple non-volatile memory elements, chips, or dies. A controller may check the status of a die, and the die may indicate a "ready" status if it is ready to begin a new storage operation, or a "busy" status if it is not ready for a new command. The controller may queue or schedule further storage operations for multiple dies based on estimating when each die is likely to be ready. However, estimations of when a die is likely to be ready may be inaccurate, leading to delays. Additionally, attempting to avoid such delays by improving the accuracy of the estimation process may significantly increase the complexity of the controller.

SUMMARY

Apparatuses are presented for providing a preliminary ready indication for non-volatile memory. In one embodiment, a non-volatile memory element is configured to initiate a write operation for one or more storage cells of the non-volatile memory element. In a certain embodiment, the non-volatile memory element is configured to determine whether a progress threshold is satisfied for the write operation. In a further embodiment, the non-volatile memory element is configured to provide a preliminary ready indication, indicating that the progress threshold is satisfied.

An apparatus, in another embodiment, includes a non-volatile storage element configured to begin programming one or more storage cells of the non-volatile storage element. In a certain embodiment, the non-volatile storage element is configured to determine whether a progress threshold is satisfied for programming the one or more storage cells. In a further embodiment, the non-volatile storage element is configured to indicate, prior to completing programming of the one or more storage cells, that the progress threshold is satisfied. In certain embodiments, a controller is configured to schedule further programming of the non-volatile storage element based on the non-volatile storage element indicating that the progress threshold is satisfied.

Methods are presented for providing a preliminary ready indication for non-volatile memory. In one embodiment, a method includes starting a process for writing data to one or more storage cells of a non-volatile memory element. In a certain embodiment, the method includes determining whether a progress threshold is satisfied for writing the data. In some embodiments, the progress threshold may be based on a number of storage cells of the non-volatile memory element that satisfy one or more verify thresholds for writing the data. In certain embodiments, the method includes sending a preparatory ready signal from the non-volatile memory element to a controller. In further embodiments, the preparatory ready signal indicates that the progress threshold is satisfied.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
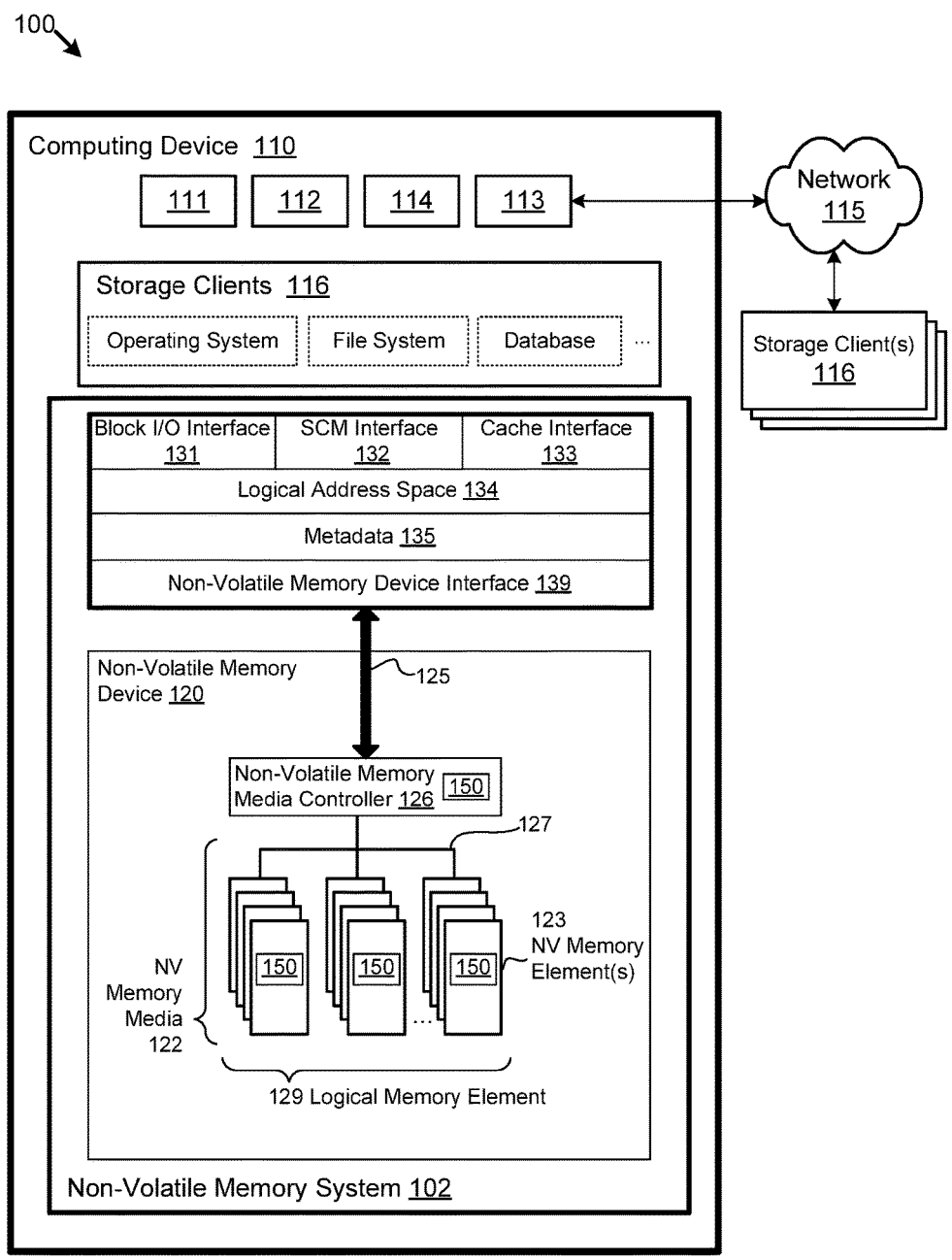
FIG. 1 is a schematic block diagram illustrating one embodiment of a system comprising a preliminary ready component.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising a preliminary ready component 150 for a non-volatile memory device 120. The preliminary ready component 150 may be part of and/or in communication with a non-volatile memory media controller 126, a non-volatile memory element 123, a device driver, or the like. The preliminary ready component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the preliminary ready component 150 may include one or more computer readable instructions stored on the non-transitory storage medium 114.

The non-volatile memory system 102, in the depicted embodiment, includes a preliminary ready component 150. The preliminary ready component 150, in one embodiment, is configured to initiate a write operation for storage cells of a non-volatile memory element 123, determine whether a progress threshold is satisfied for the write operation, and provide a preliminary ready indication, indicating that the progress threshold is satisfied. In various embodiments, providing a preliminary ready, preparatory ready, or "almost ready" signal may allow a controller to schedule further storage operations for a non-volatile memory element 123 based on actual progress of an ongoing storage operation, rather than on a possibly inaccurate estimate of when the non-volatile memory element 123 will be ready for further storage operations. In certain embodiments, a preliminary ready indication, preparatory ready signal, and/or "almost ready" signal may indicate that a non-volatile memory element 123 is in an "almost ready" state as described below with regard to FIG. 5, based on the progress threshold being satisfied. For example, the preliminary ready indication, preparatory ready signal, or "almost ready" signal may indicate that the progress threshold is satisfied, and therefore that the non-volatile memory element 123 is almost ready, mostly ready, nearly ready, close to ready, or the like, to perform a further storage operation.

In one embodiment, the preliminary ready component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the preliminary ready component 150 may comprise executable software code, such as a device driver or the like, stored on the computer readable storage medium 114 for execution on the processor 111. In a further embodiment, the preliminary ready component 150 may include a combination of both executable software code and logic hardware.

In one embodiment, the preliminary ready component 150 is configured to receive storage requests from a device driver or other executable application via a bus 125 or the like. The preliminary ready component 150 may be further configured to transfer data to/from a device driver and/or storage clients 116 via the bus 125. Accordingly, the preliminary ready component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the preliminary ready component 150 may receive storage requests as an API call from a storage client 116, as an IO-CTL command, or the like. The preliminary ready component 150 is described in further detail below with regard to FIG. 6 and FIG. 7.

According to various embodiments, a non-volatile memory controller 126 comprising a preliminary ready component 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 2:
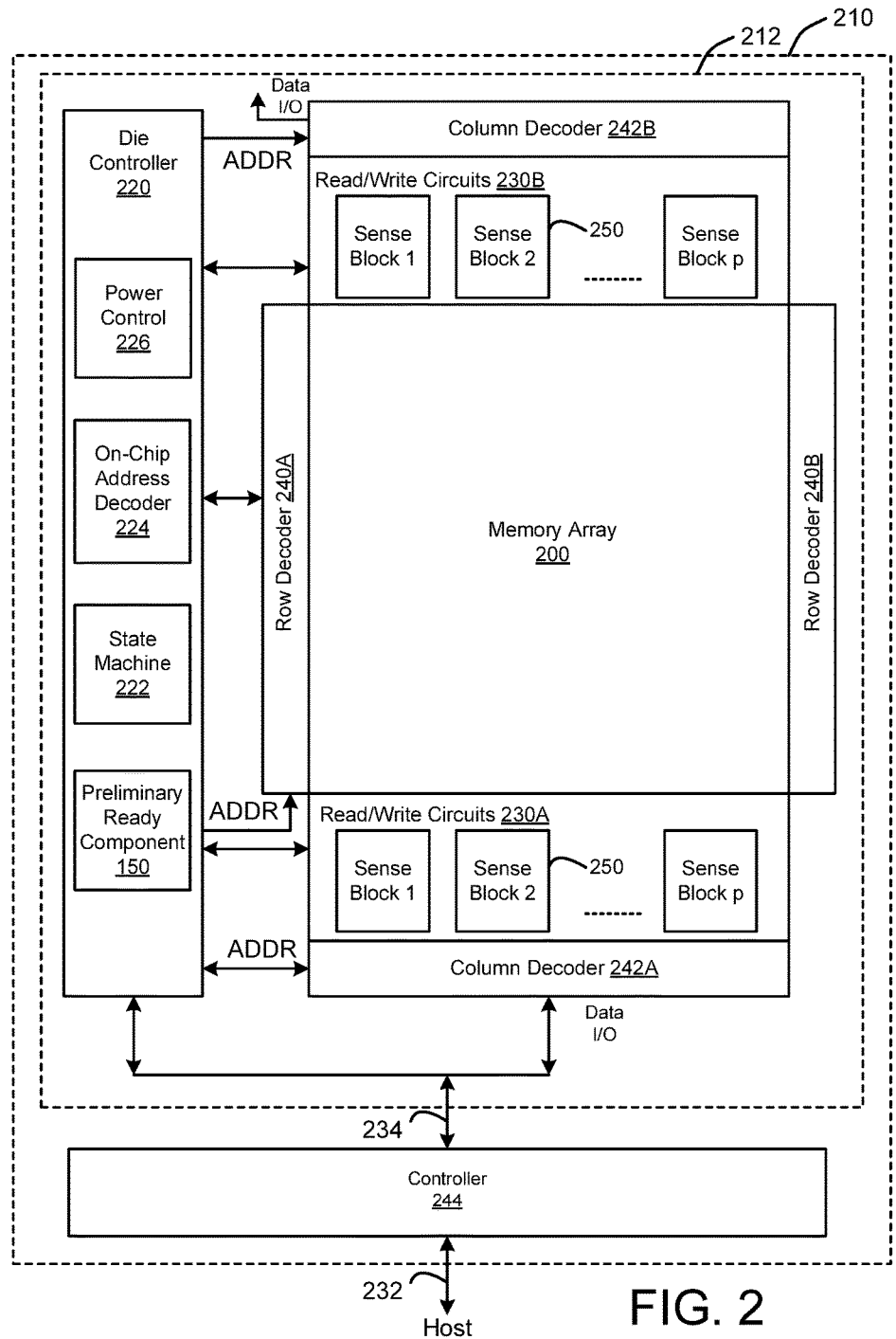
FIG. 2 is a schematic block diagram illustrating another embodiment of a system comprising a preliminary ready component.

FIG. 2 illustrates an embodiment of a non-volatile storage device 210 that may include one or more memory die or chips 212. The nonvolatile storage device 210 may be substantially similar to the nonvolatile memory device 120 described with reference to FIG. 1. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a preliminary ready component 150, a state machine 222, an on-chip address decoder 224, and a power control circuit 226. The preliminary ready component 150, in one embodiment, is configured to initiate a write operation for storage cells of the memory array 200, determine whether a progress threshold is satisfied for the write operation, and provide a preliminary ready indication, indicating that the progress threshold is satisfied.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In certain embodiments, the state machine 222 includes an embodiment of the preliminary ready component 150. The preliminary ready component 150, in certain embodiments, may include software of a device driver, and/or software, firmware, or hardware in a device controller 244, a die controller 220 and/or a state machine 222.

In one embodiment, one or any combination of die controller 220, preliminary ready component 150, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 3:
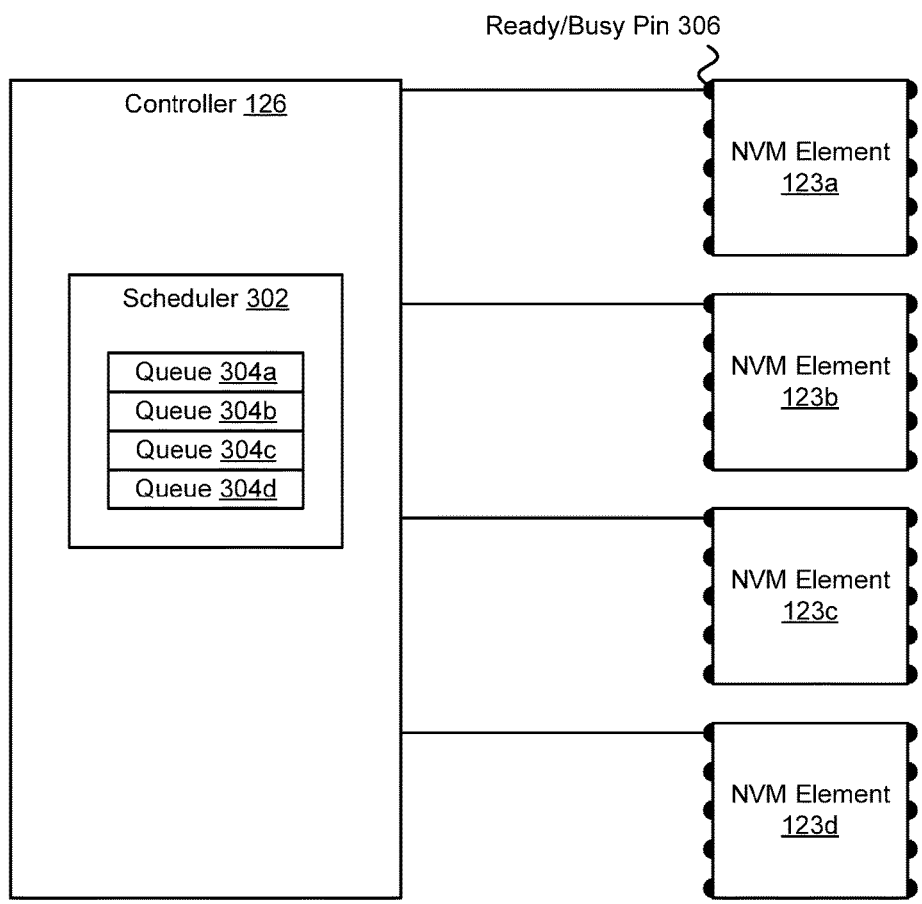
FIG. 3 is a schematic block diagram illustrating one embodiment of a controller in communication with multiple non-volatile memory elements.

FIG. 3 depicts one embodiment of a controller 126 in communication with multiple non-volatile memory elements 123. The controller 126 may be substantially similar to the non-volatile memory media controller 126 described above with regard to FIG. 1, and/or the controller 244 described above with regard to FIG. 2. In one embodiment, the controller 126 may include a hardware controller for a storage device including the non-volatile memory elements 123. In another embodiment, the controller 126 may include a device driver for a storage device including the non-volatile memory elements 123, and the device driver may include logic hardware and/or executable code stored on one or more computer readable storage media. The non-volatile memory elements 123 may be substantially similar to the non-volatile memory elements 123 described above with regard to FIG. 1 and/or the memory die or chips 212 described above with regard to FIG. 2. In the depicted embodiment, the controller 126 includes a scheduler 302, and the non-volatile memory elements 123 include ready/busy pins 306.

In general, in various embodiments, a controller 126 may be communicatively coupled to non-volatile memory elements 123 via a bus (e.g., bus 127 of FIG. 1) to manage data operations, store data, read data, transfer data to or from storage clients 116, and the like. In certain embodiments, the non-volatile memory elements 123 may be chips, packages, planes, die, or the like, and the controller 126 may be included in the same memory device as the non-volatile memory elements 123. In the depicted embodiment, the controller 126 is coupled to four non-volatile memory elements 123a-d, but in another embodiment, a controller 126 may be coupled to a different number of non-volatile memory elements 123.

The scheduler 302, in various embodiments, is configured to schedule storage operations, such as write operations, program operations, erase operations, read operations, and the like, for the non-volatile memory elements 123. For example, in various embodiments, the scheduler 302 may queue requests or commands for storage operations, and dispatch the requests or commands to individual non-volatile memory elements 123 when the non-volatile memory elements 123 are ready. In certain embodiments, the scheduler 302 may schedule some operations for any available (or the next available) non-volatile memory element 123, while scheduling other operations for particular non-volatile memory elements 123. For example, in one embodiment, a write operation for storing data may be scheduled for any available non-volatile memory element 123, and the controller 126 and/or a device driver may update a logical-to-physical mapping to indicate the physical location where data for a logical address is stored. By contrast, a read operation is scheduled for the non-volatile memory element 123 that stores the requested data. Similarly, the scheduler 302 may schedule some operations (e.g., write operations for different addresses) out of order, but may maintain an order for other operations (e.g., a read and a write operation for the same address). Various ways to schedule storage operations for multiple non-volatile memory elements 123 will be clear in view of this disclosure.

In certain embodiments, the scheduler 302 includes, uses, or implements a queue-per-die system, including multiple queues 304a-d, corresponding to the multiple non-volatile memory elements 123a-d. In the depicted embodiment, the scheduler 302 includes four queues 304a-d corresponding to the four depicted non-volatile memory elements 123a-d, but in another embodiment, a scheduler 302 may include a different number of queues 304 for a different number of non-volatile memory elements 123. In various embodiments, each queue 304a-d queues commands, requests, or the like for storage operations on corresponding non-volatile memory elements 123a-d, and the scheduler 302 dispatches the requests or commands to the individual non-volatile memory elements 123a-d as they become available.

In some embodiments, the scheduler 302 may select a queue 304 for a storage operation that can be scheduled for any available non-volatile memory element 123 based on a prediction or estimate of when busy non-volatile memory elements 123 are likely to be ready to perform further storage operations. However, inaccurate predictions or estimations of when non-volatile memory elements 123 will be ready may cause delays. For example, if a write operation is scheduled in queue 304a, but non-volatile memory element 123b becomes ready while non-volatile memory element 123a is still busy, then the write operation would have been processed faster if it had been scheduled in queue 304b.

In the depicted embodiment, the non-volatile memory elements 123 include ready/busy pins 306. In various embodiments, a "pin" may refer to a pad, pin, lead, wire, or other electrical contact for a non-volatile memory element 123. The ready/busy pins 306 may be coupled to a bus (e.g., bus 127 of FIG. 1, or the like) to communicate with the controller 126. In certain embodiments, the non-volatile memory elements 123 may use the ready/busy pins 306 to indicate a ready or busy status. In one embodiment a "ready" status may indicate that the non-volatile memory element 123 is ready to begin a storage operation, to receive a command or data for a storage operation, or the like. In a further embodiment, a "busy" status may indicate that the non-volatile memory element 123 is still processing a first storage operation, or is otherwise not available for a further storage operation. In various embodiments, a non-volatile memory element 123 may indicate a ready or busy status using a ready/busy pin 306 in various ways. For example, in one embodiment, one voltage may indicate "ready" and another voltage may indicate "busy." In another embodiment, a constant voltage may indicate "ready," and a pulsed voltage may indicate "busy." Various ways of using a ready/busy pin 306 to indicate a ready or busy status for a non-volatile memory element 123 will be clear in view of this disclosure.

In another embodiment, a non-volatile memory element 123 may provide a ready or busy status indication without using a dedicated ready/busy pin 306. For example, a controller 126 may poll a non-volatile memory element 123 to request a ready or busy status indication, and may receive the status indication over a control bus, a data bus, or the like.

The scheduler 302, in certain embodiments, may use ready or busy status indications (e.g., received via the ready/busy pins 306) to estimate when non-volatile memory elements 123 will become available for subsequent data operations, and to determine which queue 304 to schedule a data operation in. For example, the scheduler may use a moving average duration of past "busy" statuses for each non-volatile memory element 123 to estimate a likely duration for a current "busy" status, and to estimate a remaining time until a non-volatile memory element 123 is available for a subsequent data operation. Various ways of estimating non-volatile memory element 123 availability based on ready or busy status indications will be clear in view of this disclosure. However, estimates of when a non-volatile element 123 will be in a "ready" status, based on past "ready" or "busy" status indications, may be inaccurate. For example, the duration of a write operation may change over time, with age or wear of a non-volatile memory element 123. Thus, in certain embodiments, the preliminary ready component 150 may provide a preliminary ready indication (e.g., in response to polling by the controller 126, using a ready/busy pin 306, or the like), indicating that a progress threshold has been satisfied.

In general, in various embodiments, a preliminary ready indication, preparatory ready signal, or the like, may indicate that a non-volatile memory element 123 is "almost" ready (e.g., mostly ready, nearly ready, close to ready, or the like) for a further data operation, based on progress of an ongoing data operation. In further embodiments, the scheduler 302 may schedule further data operations (e.g., programming, erasing, reading, the like) for a non-volatile memory element 123 based on receiving the preliminary ready indication. Thus, providing a preliminary ready indication may, in some embodiments, avoid problems or delays associated with potentially inaccurate estimations, by the controller 126, of when a non-volatile memory element 123 is likely to be ready.

Figure 4A:
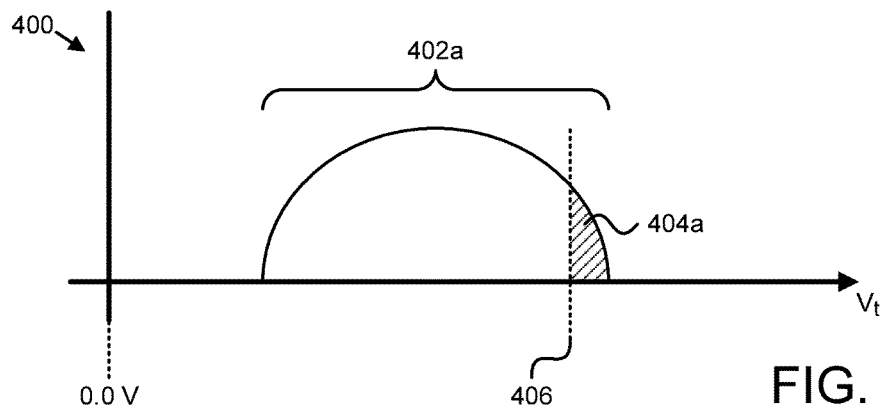
FIG. 4A is a graph illustrating one embodiment of a distribution of threshold voltages for storage cells of a non-volatile memory element, during programming.
Figure 4B:
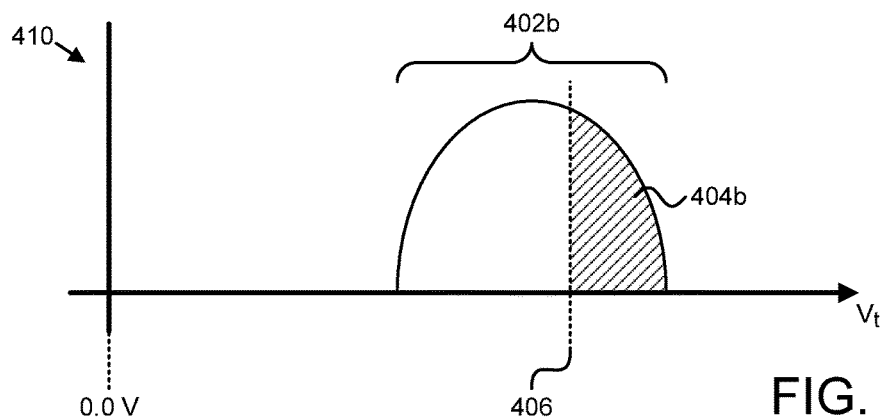
FIG. 4B is a graph illustrating another embodiment of a distribution of threshold voltages for storage cells of a non-volatile memory element, during programming.
Figure 4C:
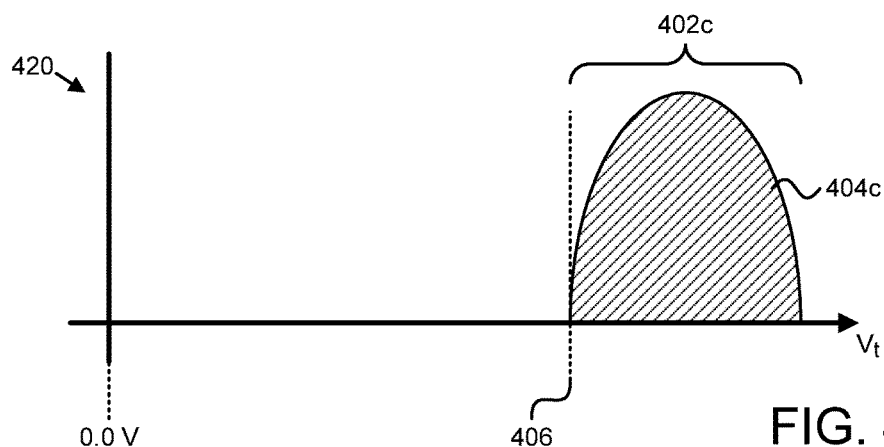
FIG. 4C is a graph illustrating a further embodiment of a distribution of threshold voltages for storage cells of a non-volatile memory element, during programming.

FIG. 4A, FIG. 4B, and FIG. 4C are graphs 400, 410, 420 depicting a distribution of threshold voltages for storage cells of a non-volatile memory element 123, during different phases of programming. In the depicted embodiment, each graph 400, 410, 420 includes a bell-shaped curve 402 indicating the distribution of storage cells at different threshold voltages, a verify threshold 406, and a shaded area 404 indicating a number of cells satisfying the verify threshold 406.

As used herein, a "cell" refers to the smallest physical unit of storage or memory in a non-volatile memory element 123. In some embodiments, each cell has a physical and/or electrical property which may be altered to encode or otherwise store data. For example, in flash memory, a cell may include a floating gate transistor, and the physical property used to encode data may be the charge stored on the floating gate, a stored read voltage level caused by the charge stored on the floating gate, the threshold voltage $V_t$ that is sufficient to make the transistor conduct when applied to the control gate, or the like. As another example, in phase change memory, a cell may be a region of chalcogenide glass, and the physical property used to encode data may be the degree of crystallization of the region, the electrical resistance of the cell, or the like. Various types of storage cells for various types of non-volatile memory will be clear in view of this disclosure.

In the depicted embodiment, the storage cells are flash memory cells (e.g., floating gate transistors), and programming includes applying voltage pulses to change the threshold voltage $V_t$ for the cell. The threshold voltage $V_t$ is shown on the horizontal axis of each of the graphs 400, 410, 420, and the vertical axis illustrates a number of cells, so that the bell-shaped curve 402 in each graph 400, 410, 420, indicates a distribution of cells having different threshold voltages $V_t$. The graphs 400, 410, 420 illustrate a programming process that increases the threshold voltage $V_t$ for storage cells from an erased state (e.g., a low or negative threshold voltage $V_t$ for the storage cells) to a programmed state (e.g., a threshold voltage $V_t$ above a verify threshold 406 for the storage cells. However, the verify threshold(s), progress thresholds, and the like discussed below are equally relevant to an erase process that decreases the threshold voltage $V_t$ for storage cells back to the erased state, to program processes with multiple programmed states and corresponding verify thresholds 406, or to processes for writing data that manipulate a physical property other than a threshold voltage $V_t$, for storage cells of a different type of non-volatile memory element 123.

In the depicted embodiment, a cell is programmed by applying voltage pulses that increase the threshold voltage $V_t$ of the cell, until the threshold voltage $V_t$ for the cell satisfies a verify threshold 406. In certain embodiments, a cell may be referred to as satisfying a program verify threshold 406 if the threshold voltage $V_t$ for the cell is greater than or equal to the verify threshold 406 voltage. Program voltage pulses may be inhibited for cells that satisfy the verify threshold 406, but may continue for cells that do not satisfy the verify threshold 406.

In FIG. 4A, the graph 400 depicts an early stage of a programming process for writing data to storage cells. The bell-shaped curve 402a indicating the distribution of cells is broad compared to later stages depicted in graphs 410, 420 in FIGS. 4B and 4C, but a small number of cells (indicated by the shaded area 404a) already have threshold voltages $V_t$ that satisfy the verify threshold 406, in response to early program voltage pulses.

In FIG. 4B, the graph 410 depicts an intermediate stage of a programming process for writing data to storage cells. The bell-shaped curve 402b indicating the distribution of cells has narrowed compared to the earlier stage depicted in graph 400 of FIG. 4A, as further program voltage pulses have been applied to cells with threshold voltages $V_t$ that do not satisfy the verify threshold 406, but have been inhibited for cells that satisfy the verify threshold 406. Additionally, the number of cells (indicated by the shaded area 404b) that satisfy the verify threshold 406 has increased in comparison to the graph 400 of FIG. 4A.

In FIG. 4C, the graph 420 depicts a final stage of a programming process for writing data to storage cells. The bell-shaped curve 402c indicating the distribution of cells has narrowed further compared to the earlier stages depicted in graphs 400, 410 of FIG. 4A and FIG. 4B, and the shaded area 404c that indicates the number of cells satisfying the verify threshold 406 encompasses the entire bell-shaped curve 402c, indicating that all the cells are programmed, and the programming process is complete. (In another embodiment, the programming process may be complete when a certain percentage of cells satisfies the verify threshold 406, and a lower-voltage threshold for determining whether cells are in a programmed or erased state when reading data may compensate for cells that were programmed without satisfying the verify threshold 406)

In FIGS. 4A, 4B, and 4C, the bell-shaped curves 402 indicate the distribution of cells that are being programmed to a programmed state corresponding to the verify threshold 406. In certain embodiments, programming a page of data may include programming some cells for the page, and leaving other cells in an erased state. For example, the erased state may correspond to a binary "1" and the programmed state may correspond to a binary "0." Cells remaining in the erased state are not depicted in graphs 400, 410, 420. In further embodiments, a cell may store multiple bits of data using multiple states (e.g., four states for two bits of data, eight states for three bits of data, or the like), and a plurality of verify thresholds 406 may define the states. For example, cells to be programmed into a first programmed state may have program voltage pulses inhibited after satisfying a first program verify threshold 406, cells to be programmed into a second programmed state may have program voltage pulses inhibited after satisfying a second program verify threshold 406, and so on. A plurality of verify thresholds 406 for different states are not depicted in graphs 400, 410, 420, but may nevertheless be used for various types of non-volatile memory elements 123.

In various embodiments, a preliminary ready component 150 may provide a preliminary ready indication based on a progress threshold being satisfied for a write operation, such as an erase operation, or the program operation depicted in graphs 400, 410, 420. In certain embodiments, the progress threshold may be based on a number of storage cells of a non-volatile memory element 123 that satisfy one or more verify thresholds 406 for the write operation. For example, in one embodiment, the preliminary ready component 150 may determine that the progress threshold is satisfied if the percentage of cells that satisfy the verify threshold 406 in relation to the number of cells being programmed (e.g., the ratio of the shaded area 404 to the area of the bell-shaped curve 402) meets or exceeds a certain percentage. In another embodiment, data whitening, data shaping, or error-correction algorithms may be applied to the data to be written, so that a program operation for a page of data programs approximately half of the cells for the page, while leaving the other half in the erased state. With the number of cells to be programmed being known, predictable, or approximately constant, the preliminary ready component 150 may determine that the progress threshold is satisfied if the number of cells that satisfy the verify threshold 406 meets or exceeds a certain number (rather than determining a percentage).

In various embodiments, where cells store multiple bits of data using multiple states using a plurality of verify thresholds 406, the preliminary ready component 150 may determine that the progress threshold is satisfied based on cells satisfying one or more of the verify thresholds 406 in various ways. For example, the progress threshold may be satisfied based on the number of cells that satisfy a verify threshold 406 for the highest-voltage stage, on the number of cells that satisfy verify thresholds 406 for their eventual intended states (and are therefore inhibited from further programming pulses), or the like. Similarly, for an erase operation, erase verify pulses may be applied to a block of cells until the cells satisfy an erase verify threshold (e.g., the threshold voltage $V_t$ for the cells is below the erase verify threshold voltage), and the preliminary ready component 150 may determine that the progress threshold is satisfied based on cells satisfying the erase verify threshold. Various ways of defining a progress threshold for providing a preliminary ready indication will be clear in view of this disclosure.

Figure 5:
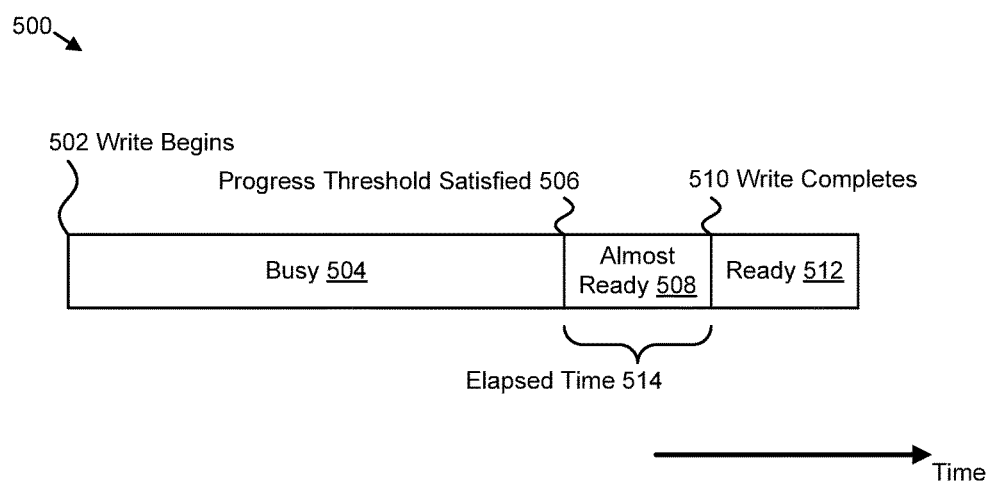
FIG. 5 is a timeline illustrating one embodiment of busy, almost ready, and ready states for a non-volatile memory element.

FIG. 5 is a timeline 500 depicting one embodiment of a busy state 504, an almost ready state 508, and a ready state 512 for a non-volatile memory element 123. At time 502, the non-volatile memory element 123 initiates a write operation, and the non-volatile memory element 123 enters a busy state 504. In certain embodiments, the busy state 504 may be communicated or indicated to a controller 126 (e.g., via a ready/busy pin 306, in response to polling, or the like), and may indicate that the non-volatile memory element 123 is busy processing the write operation that began at time 502, and is therefore not available to receive further storage requests. The timeline 500 is depicted in relation to a write operation, but a similar progression of a busy state 504, an almost ready state 508, and a ready state 512 for a non-volatile memory element 123 may similarly occur for a program operation, an erase operation, a read operation, or the like.

At time 506, the write operation is still in process, but the non-volatile memory element 123 determines that a progress threshold is satisfied for the write operation, and the non-volatile memory element 123 enters an "almost ready," preliminary ready, or preparatory ready state 508. In certain embodiments, the almost ready state 508 may be communicated or indicated to a controller 126 (e.g., via a ready/busy pin 306, in response to polling, or the like), and may indicate that the non-volatile memory element 123 is still busy processing the write operation, but that the non-volatile memory element 123 is predicted to be available for a subsequent operation within a certain elapsed time 514 between the progress threshold being satisfied for the write operation, and the write operation being completed.

At time 510, the write operation is completed, and the non-volatile memory element 123 enters a ready state 512. In certain embodiments, the ready state 512 may be communicated or indicated to a controller 126 (e.g., via a ready/busy pin 306, in response to polling, or the like), and may indicate that the non-volatile memory element 123 is ready to receive commands and or data, and/or to process a subsequent storage operation. In certain embodiments, a preliminary ready indication, a preparatory ready signal, or the like, that communicates the "almost ready" state 508 (or the determination at time 506 that the progress threshold is satisfied) to the controller 126 may allow the controller 126 to schedule further writing or programming for the non-volatile memory element 123 (e.g., by queuing command, address, and/or data information for a subsequent storage operation), based on the non-volatile memory element 123 reporting its own progress, rather than on a potentially inaccurate estimate by the controller 126 of when the non-volatile memory element 123 will enter the ready state.

In certain embodiments, the elapsed time 514 may refer to any measurement or indication corresponding to the amount of time that the non-volatile memory element 123 is in the almost ready state 508. In various embodiments, an elapsed time 514 may refer to a measurement of real time (e.g., in microseconds, nanoseconds, or the like), a number of clock cycles, a count of write pulses, program pulses, erase pulses, or the like, a program loop count, a percentage of the total duration of the write operation, or the like. Many ways of representing an elapsed time 514 will be clear in view of this disclosure. Additionally, an elapsed time 514 for the almost ready state 508 may be measured in various ways. For example, the elapsed time 514 may begin based on determining at time 506 that the progress threshold is satisfied, providing the preliminary ready indication to the controller 126, or the like. Similarly, the elapsed time 514 may end based on completing the write operation, communicating the ready state 512 to the controller 126, or the like. Various endpoints suitable for measuring an elapsed time 514 corresponding to the duration of the almost ready state 508 will be clear in view of this disclosure.

In some embodiments, the non-volatile memory element 123 may be configured to update the progress threshold for a subsequent write operation, based on the elapsed time 514. For example, in one embodiment, the controller 126 may send a request to the non-volatile memory element 123 that specifies a requested elapsed time 514 (e.g., an actual time, a number of clock cycles, a number of program loops, or the like) between the non-volatile memory element 123 providing the preliminary ready indication and completing the write operation. The requested elapsed time 514, in certain embodiments may be based on a speed of the controller 126 for scheduling further programming of the non-volatile memory element 123. For example, a controller 126 that can quickly schedule further programming may request less advance notice (e.g., a shorter requested elapsed time 514) before the non-volatile memory element 123 is in the ready state, but a controller 126 that takes longer to schedule further programming may request more advance notice (e.g., a longer requested elapsed time 514) before the non-volatile memory element 123 is in the ready state. In another embodiment, the elapsed time 514 may be a specified parameter (e.g., set by a manufacturer) for a non-volatile memory element 123.

In one embodiment, if the actual elapsed time 514 is less than the requested or otherwise specified elapsed time 514, the non-volatile memory element 123 may update the progress threshold to provide a longer elapsed time 514 (e.g., a progress threshold based on a number or percentage of programmed storage cells may be updated to be satisfied at a lower number or percentage). In another embodiment, if the actual elapsed time 514 is greater than the requested or otherwise specified elapsed time 514, the non-volatile memory element 123 may update the progress threshold to provide a shorter elapsed time 514 (e.g., a progress threshold based on an expected count of write pulses for the write operation may be set to be satisfied at a higher count of write pulses). Various ways of updating different types of progress thresholds to provide longer or shorter elapsed times 514 will be clear in view of this disclosure. In general, in various embodiments, updating a progress threshold based on the elapsed time 514 may provide predictability or low variation in the elapsed time 514 for the almost ready state 508 over multiple storage operations, facilitating better scheduling of further storage operations by the controller 126. Conversely, larger variations in the elapsed time 514 for the almost ready state 508 may result in a first non-volatile memory element 123 providing a preliminary ready indication to a controller 126 before a second non-volatile memory element 123, but actually entering the ready state 512 after the second non-volatile memory element 123, leading to scheduling-based delays.

Figure 6:
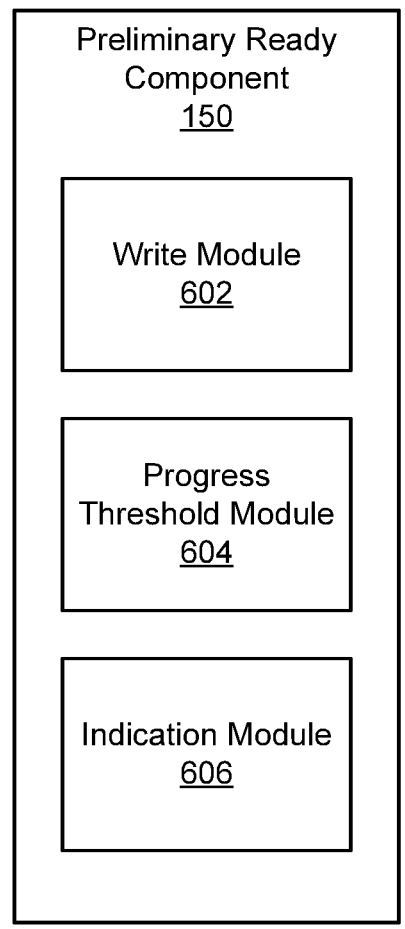
FIG. 6 is a schematic block diagram illustrating one embodiment of a preliminary ready component.

FIG. 6 depicts one embodiment of a preliminary ready component 150. The preliminary ready component 150 may be substantially similar to the preliminary ready component 150 described above with regard to FIG. 1 and FIG. 2. In general, as described above, the preliminary ready component 150 is configured to initiate a write operation for storage cells of a non-volatile memory element 123, determine whether a progress threshold is satisfied for the write operation, and provide a preliminary ready indication, indicating that the progress threshold is satisfied. In the depicted embodiment, the preliminary ready component 150 includes a write module 602, a progress threshold module 604, and an indication module 606. In various embodiments, the write module 602, progress threshold module 604, and indication module 606 may be implemented or embodied by portions of a non-volatile memory element 123, such as a die controller 220, a state machine 222, or the like.

The write module 602, in one embodiment, is configured to start, begin, or initiate a write operation for one or more storage cells of the non-volatile memory element 123. As described above, a storage cell or memory cell refers to the smallest physical unit of storage or memory in a non-volatile memory element 123, such as a floating gate transistor for flash memory, a region of chalcogenide glass for phase change memory, a memristor, or the like. Various types of storage cells will be clear in view of this disclosure.

A write operation or a process for writing data, in various embodiments, may refer to any operation or process that changes one or more values stored by one or more storage cells, such as a program operation, an erase operation, an operation that writes data in place (e.g., over existing data), a garbage collection, grooming, or wear leveling operation that moves data to a new location, or the like. In one embodiment, a write operation or process for writing data may comprise a program operation. In a further embodiment, a program operation may write one or more pages of data to erased storage cells (e.g., by changing a stored voltage value, a stored resistance value, or the like). In another embodiment, a write operation or process for writing data may comprise an erase operation. An erase operation, in certain embodiments, may erase data from a set of storage cells. For example, an erase operation may change the stored voltage value, stored resistance value, or the like, for a set of storage cells to a value corresponding to an erased state. In certain embodiments, an erase operation may erase a block of data comprising multiple programmed pages.

In various embodiments, the write module 602 initiating a write operation, starting a process for writing data, or the like, may refer to the non-volatile memory element 123 beginning programming of one or more storage cells, beginning erasing of one or more storage cells, or otherwise commencing any write operation or process for writing data, either by taking steps or actions in preparation for writing data, or by taking steps or actions that change stored values, or the like. For example, the write module 602 beginning programming may include row or column decoding, applying inhibit voltages to columns where cells will not be programmed, applying program or verify pulses to a row where cells will be programmed, or the like. Similarly, the write module 602 beginning erasing may include applying erase voltage pulses to a block of cells, applying verify pulses to determine whether the cells satisfy an erase verify threshold or the like. Various ways for a write module 602 to initiate a write operation, starting a process for writing data, or the like, for different types of storage cells, will be clear in view of this disclosure.

The progress threshold module 604, in one embodiment, is configured to determine whether a progress threshold is satisfied for the write operation initiated by the write module 602. For example, the write module 602 may start a process for writing data to one or more storage cells, begin programming one or more storage cells, or begin erasing one or more storage cells, and the progress threshold module 604 may determine whether a progress threshold is satisfied for writing the data, programming the storage cells, or erasing the storage cells.

In general, in various embodiments, the progress threshold module 604 may track, monitor, measure or evaluate the progress of a write operation in various ways. In certain embodiments, a "progress threshold" may refer to a threshold value that divides a range or set of possible values for a measurement, metric, or indication of the progress of a write operation (or conversely, of how much of a write operation remains to be completed) into values that correspond to earlier stages of the write operation, said not to "satisfy" the progress threshold, and values that correspond to later stages of the write operation, said to "satisfy" the progress threshold.

In further embodiments, the progress threshold module 604 may determine whether the progress threshold is satisfied by comparing a value for the measurement, metric, or indication of the progress of the write operation to the threshold value. For example, in one embodiment, the progress threshold module 604 may calculate a percentage value that indicates how complete a write operation or process is, and may determine that a progress threshold is satisfied if the percentage meets a threshold value, exceeds a threshold value, or the like. Conversely, in another embodiment, the progress threshold module 604 may calculate a percentage value that indicates how much of the write operation or process is still incomplete, and may determine that a progress threshold is satisfied if the percentage meets a threshold value, is less than a threshold value, or the like. In various embodiments, a threshold value that the progress threshold module 604 uses to determine whether the progress threshold is satisfied may be a percentage value, a time value, a number of storage cells, a number of program pulses or program loops, a number of erase pulses or erase loops, a number of program verify pulses or erase verify pulses, or the like. Various measurements of the progress of a write operation, which may be used by the progress threshold module 604 to determine whether a progress threshold is satisfied, will be clear in view of this disclosure.

In certain embodiments, the progress threshold module 604 may determine whether a progress threshold is satisfied, so that the indication module 606 (described in further detail below) can provide a preliminary ready indication, preparatory ready signal, or the like (e.g., from the non-volatile memory element 123 to a controller 126) in response to the progress threshold being satisfied. Accordingly, in certain embodiments, the progress threshold may be set or updated to provide a preliminary ready signal that facilitates the controller 126 scheduling further storage operations for the non-volatile memory element 123. Setting and updating a progress threshold, and periodically determining whether the progress threshold is satisfied, are described in further detail below with regard to FIG. 7.

In general, the overall length of a write operation, or the time to complete a process for writing data, may vary based on factors such as the age of the non-volatile memory element 123, wear of the non-volatile memory element 123, current temperature, or the like, and the controller 126 may not be able to accurately predict how long a write operation will take. By contrast, the time between a progress threshold being satisfied and completing the write operation may be more uniform, consistent, or predictable than the overall time to process a write operation, in certain embodiments, and a controller 126 may use a preliminary ready indication, preparatory ready signal, or the like, based on a progress threshold, to schedule subsequent operations for the next available non-volatile memory element 123 without relying on complex and possibly inaccurate estimation algorithms to predict the next available non-volatile memory element 123.

In certain embodiments, the progress threshold may be based on a number of storage cells of the non-volatile memory element 123 that satisfy one or more verify thresholds for the write operation (e.g., the verify threshold 406 of FIGS. 4A-4C). In certain embodiments, a write operation may store or encode data for a storage cell by altering a physical or electrical property for the storage cell, such as the threshold voltage $V_t$ for a floating gate transistor, a resistance for a memristor, or the like. In further embodiments, a "verify threshold" for writing data to storage cells may refer to a threshold value that divides a range or set of possible values for the physical or electrical property that encodes or stores data for the cells into values that correspond to earlier stages of the write operation, said not to "satisfy" the verify threshold, and values that correspond to later stages of the write operation, said to "satisfy" the verify threshold. By contrast to the progress threshold, which pertains to a metric of the overall progress of a write operation (e.g., for a group or set of one or more storage cells), a verify threshold is satisfied (or not satisfied) for individual cells.

For example, in one embodiment, when the write operation is a program operation that applies program voltage pulses to increase a threshold voltage $V_t$ for flash memory cells, a verify threshold may be a program verify threshold, that is satisfied for a cell with a threshold voltage $V_t$ greater than (or greater than or equal to) the value of the program verify threshold. In a certain embodiment, satisfying the program verify threshold may indicate that a cell is in a programmed state, and programming of a cell may be complete when the program verify threshold is satisfied. (In a further embodiment, program voltage pulses may be inhibited for cells that satisfy the program verify threshold, but may continue for programming cells that do not satisfy the verify threshold.)

In another embodiment, satisfying a program verify threshold may indicate the progress of a cell towards a programmed state. For example, for cells with multiple programmed states, such as multi-level cell ("MLC") flash memory, triple level cell ("TLC") flash memory, or the like, a plurality of program verify thresholds may define multiple programmed states. A cell to be programmed to an intermediate-voltage state may be fully programmed when it satisfies an intermediate-voltage program verify threshold, and program voltage pulses may be inhibited accordingly, to prevent the cell from being programmed into a higher-voltage state, but the cell satisfying a lower-voltage program voltage threshold may also indicate that the cell is approaching its intended state.

In a further embodiment, when the write operation is an erase operation that applies erase voltage pulses to decrease a threshold voltage $V_t$ for flash memory cells, a verify threshold may be an erase verify threshold, that is satisfied for a cell with a threshold voltage $V_t$ less than (or less than or equal to) the value of the erase verify threshold. In a certain embodiment, satisfying the erase verify threshold may indicate that a cell is in an erased state, and erasing of a block of cells may be complete when the erase verify threshold is satisfied for each of the cells in a block. In certain embodiments, storage cells are erased in blocks, without erase pulses being inhibited for individual cells. In another embodiment (e.g., for a type of non-volatile memory element 123 other than flash memory), cells may be erased individually, and erase pulses may be inhibited for cells that are not to be erased, or that satisfy the erase verify threshold.

In another embodiment, where the write operation is for a type of non-volatile memory element 123 other than flash memory, a verify threshold for a write operation may be based on a physical property other than a voltage. For example, a verify threshold may be a resistance threshold for resistive memory, a magnetization threshold for magnetic memory, or the like. Various types of verify thresholds for corresponding types of non-volatile memory will be clear in view of this disclosure.

In certain embodiments, the number of storage cells that satisfy one or more verify thresholds may indicate the progress of a write operation towards completion. For example, as depicted in FIGS. 4A-4C, the number of cells that satisfy a verify threshold may increase as a program operation progresses towards completion. Accordingly, in some embodiments, the progress threshold module 604 may use a progress threshold based on the number of cells that satisfy one or more verify thresholds for a write operation. In certain embodiments, where a write operation uses multiple verify thresholds (e.g., for a cell with multiple programmed states), a progress threshold may be based on the verify thresholds in a variety of ways. For example, the progress threshold may be based on a number of cells, programmed to different states, that satisfy the verify thresholds for those states, a number of cells programmed to a particular state that satisfy the verify threshold for that state, a number of cells satisfying an intermediate verify threshold, or the like.

Additionally, in various embodiments, the progress threshold may be based on a number of cells in various ways. For example, in one embodiment, the progress threshold module 604 may determine whether the progress threshold is satisfied by comparing a number of cells that satisfy a verify threshold to a threshold value for the progress threshold. In another embodiment, the progress threshold module 604 may determine whether the progress threshold is satisfied by comparing a percentage of cells that satisfy a verify threshold, or another quantity derived from the number of cells that satisfy the verify threshold, to a threshold value for the progress threshold. In a further embodiment, the progress threshold module 604 may determine whether the progress threshold is satisfied by comparing a number, percentage, or related measurement of cells that do not satisfy a verify threshold to a threshold value for the progress threshold. Various ways to base a progress threshold on a number of cells that satisfy one or more verify thresholds will be clear in view of this disclosure.

In another embodiment, the progress threshold may be based on a count of write pulses for a write operation. In various embodiments, a write operation may include applying write pulses to storage cells to change the stored value. A "write pulse" may refer to any voltage, current, or the like that is applied to a cell in a pulsed matter for writing data.

For example, for flash memory, voltage may be applied to incrementally change the threshold voltage $V_t$ for a storage cell, and write pulses may include program voltage pulses, erase voltage pulses, or the like. In some embodiments, the number of write pulses to complete a write operation may be known or predictable based on characterization of storage cells. For example, in one embodiment, the number of program pulses for programming a page of data may vary in predictable ways based on factors such as a program/erase cycle count for the storage cells, a time that the storage cells remained in an erased state before programming, a location of the storage cells within a block, a current temperature or the like.

In some embodiments, the progress threshold module 604 may obtain a predicted number of write pulses to complete a write operation in a variety of ways, such as by keeping a moving average for the number of write pulses in past operations, referencing data based on characterizing a non-volatile memory element 123 at different program/erase cycle counts, or the like. In certain embodiments, then, the progress threshold module 604 may determine whether the progress threshold is satisfied by comparing a count of write pulses for an initiated write operation to an expected count of write pulses for completing the write operation. In various embodiments, the progress threshold module 604 may compare a raw count of write pulses to a threshold count, compare a ratio of completed to expected write pulses to a threshold ratio or the like. In certain embodiments, the progress threshold may be based on the number of storage cells that satisfy one or more verify thresholds, a count of write pulses for the write operation, or any combination of storage cells satisfying verify thresholds and count data for write pulses.

The indication module 606, in one embodiment, is configured to indicate that the progress threshold is satisfied, as determined by the progress threshold module 604. For example, in various embodiments, the indication module 606 may provide a preliminary ready indication, indicating that the progress threshold is satisfied, send a preparatory ready signal from the non-volatile memory element 123 to a controller 126 indicating that the progress threshold is satisfied, or the like.

In various embodiments, "indicating" that a progress threshold is satisfied may refer to the non-volatile memory element 123 reporting, showing, signaling, or otherwise communicating that the progress threshold is satisfied. A "preliminary ready indication," "preparatory ready signal," "almost ready signal" or the like may refer to any signal, indication, communication, or the like, that indicates that the progress threshold is satisfied. In general, as described above, providing a preliminary ready indication, preparatory ready signal, or other indication that the progress threshold is satisfied may provide advance warning to a controller 126 that a non-volatile memory element 123 is approaching a "ready" state, so that the controller 126 can schedule subsequent storage operations appropriately. Thus, in various embodiments, the indication module 606 is configured to indicate that the progress threshold is satisfied prior to completing a write operation or process for writing data (e.g., programming or erasing) initiated by the write module 602.

In one embodiment, a non-volatile memory element 123 may be configured to use the indication module 606 to provide the preliminary ready indication in response to being polled by a controller 126. For example, the controller 126 may send a status request to a non-volatile memory element 123, and receive a preliminary ready indication (e.g., reporting an "almost ready" status). In another embodiment, a non-volatile memory element 123 may be configured to use the indication module 606 to provide the preliminary ready indication using an existing ready/busy pin for the non-volatile memory element 123 (e.g., the ready/busy pin 306 of FIG. 3). For example, the non-volatile memory element 123 may assert a first signal, voltage or the like on a ready/busy pin to indicate a "ready" state, assert a second signal, voltage or the like on the ready/busy pin to indicate a "busy" state, and may provide a preliminary ready indication by asserting a third signal, voltage or the like on the ready/busy pin to indicate an "almost ready" state. Various ways for a non-volatile memory element 123 to provide a preliminary ready indication, either automatically or in response to polling, will be clear in view of this disclosure.

Figure 7:
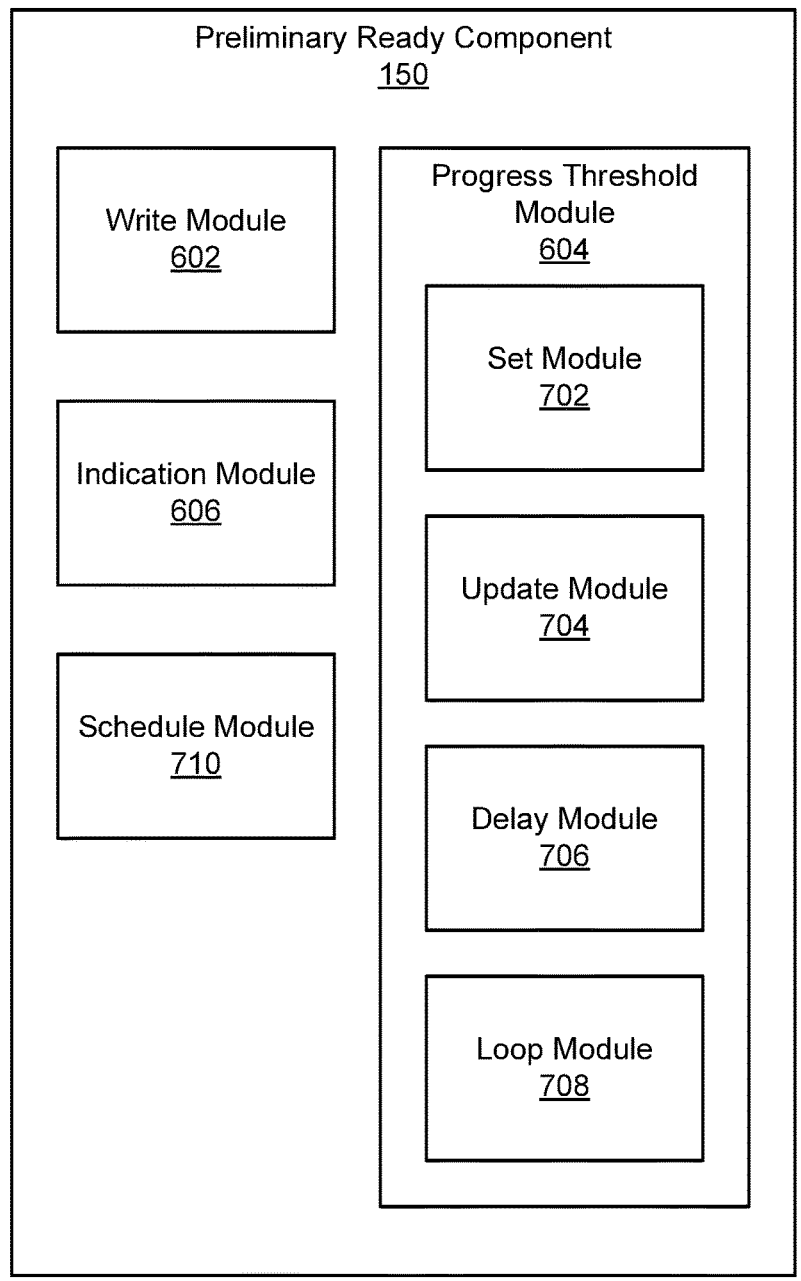
FIG. 7 is a schematic block diagram illustrating another embodiment of a preliminary ready component.

FIG. 7 depicts another embodiment of a preliminary ready component 150. The preliminary ready component 150, in certain embodiments, may be substantially similar to the preliminary ready component 150 described above with regard to FIG. 1, FIG. 2, and/or FIG. 6. In the depicted embodiment, the preliminary ready component 150 includes a write module 602, a progress threshold module 604, and an indication module 606, which may be configured substantially as described above with regard to FIG. 6. The progress threshold module 604, in the depicted embodiment, includes a set module 702, an update module 704, a delay module 706, and a loop module 708. The preliminary ready component 150, in the depicted embodiment, includes a schedule module 710.

The schedule module 710, in one embodiment, is used by a controller 126 to schedule a subsequent write operation (e.g., further or subsequent programming, erasing, or the like), for the non-volatile memory element 123 based on the non-volatile memory element 123 using the indication module 606 to indicate that the progress threshold is satisfied (e.g., by sending a preparatory ready signal). Thus, in certain embodiments, the write module 602, progress threshold module 604, and indication module 606 may be implemented by portions of a non-volatile memory element 123, and the schedule module 710 may be implemented by a controller 126. In general, in various embodiments, "scheduling" subsequent write operations may refer to queuing or otherwise organizing the order for sending different write operations, requests, or commands to different non-volatile memory elements 123. For example, as described above with regard to the scheduler 302 of FIG. 3, a controller 126 may include a scheduler 302 with a separate queue 304 corresponding to each non-volatile memory element 123, and scheduling further programming for a non-volatile memory element 123 may include enqueuing a program operation, request, or command in the corresponding queue 304 for the non-volatile memory element 123.

In a certain embodiment, where write operations are ongoing for multiple non-volatile memory elements 123, it is likely that the first non-volatile memory element 123 to provide a preliminary ready indication will also be the first non-volatile memory element 123 to be ready for a subsequent write operation. Thus, scheduling the next write operation to be performed for the first non-volatile memory element 123 to provide a preliminary ready indication may minimize or reduce delay in processing the next write operation, and subsequent write operations, compared to a controller 126 attempting to predict the next available non-volatile memory element 123 without the use of a preliminary ready indication.

The set module 702, in one embodiment, is used by a non-volatile memory element 123 to set a progress threshold for the progress threshold module 604, based on a request sent by the controller 126 to the non-volatile memory element 123. In certain embodiments, the set module 702 may set a progress threshold, based on a request received by a non-volatile memory element 123 from the controller 126, by setting an initial progress threshold for a non-volatile memory element 123, or by updating the progress threshold for the non-volatile memory element 123. In various embodiments setting the progress threshold may include communicating the progress threshold to the progress threshold module 604 (e.g., by storing the progress threshold in a register, a region of volatile memory, or the like accessible by the progress threshold module 604.)

In general, in various embodiments, controllers 126 for various storage devices may take different amounts of time to schedule a storage operation. Providing a set module 702 to set a progress threshold for a non-volatile memory element 123 based on a request from a controller 126 may, in various embodiments, allow different controllers 126 to request different progress thresholds. In one embodiment, a request to set a progress threshold may be based on a speed of a controller 126 for scheduling further programming of a non-volatile memory element 123. For example, in one embodiment, a controller 126 may take a certain amount of time to schedule or route a subsequent write request to a non-volatile memory element 123 in response to a preliminary ready signal, and may request a progress threshold that provides that amount of time between the indication module 606 providing the preliminary ready indication and the write module 602 completing the write operation.

In various embodiments, a "request" received by the set module 702 may include any request, command, or other information from the controller 126 for setting or updating a progress threshold. For example, in one embodiment, the controller 126 may send an in-band request in conjunction with a storage operation request, to set a progress threshold for that storage operation. An in-band request may be included as part of a storage operation request. For example, a write command may include a field to indicate a location or address to write data to, and another field for a progress threshold. In another embodiment, the controller 126 may send an out-of-band request for setting or updating a progress threshold, independently of storage operation requests. For example, a non-volatile memory element 123 may provide a command for setting or updating a progress threshold, independently of storage operation requests, a test mode that allows the controller 126 to change a setting or register corresponding to a progress threshold request, or the like. Various ways of sending and receiving requests for setting or updating a progress threshold will be clear in view of this disclosure.

In various embodiments, the set module 702 may set a progress threshold based on a request from the controller 126 in various ways. For example, the request from the controller 126 may directly specify the progress threshold, as a number or percentage of cells satisfying a verify threshold, a write loop count, or the like, and the set module 702 may use the progress threshold specified by the request. In another embodiment, the request may indicate a requested elapsed time in the almost ready state, (e.g., as a measurement of real time, a number of clock cycles, a number of program loops, or the like) and the set module 702 may select a progress threshold to satisfy the requested elapsed time.

In a certain embodiment, the set module 702 may set or update a progress threshold for write operations on a non-volatile memory element 123 based on a health characteristic associated with a non-volatile memory element 123. A health characteristic may refer to any characteristic indicating or corresponding to the condition of the non-volatile memory element 123 over time, such as a measure of wear, a measure of age (independent of wear), a program/erase cycle count, an error rate, a count of bad and/or retired blocks, an average duration for a program operation, an average duration of an erase operation, or the like. In various embodiments, setting or updating a progress threshold based on a health characteristic may provide a progress threshold independent of a request from a controller. For example, in one embodiment, a set module 702 may update a progress threshold in response to the non-volatile memory element 123 completing a certain number of program/erase cycles.

In certain embodiments, multiple non-volatile memory elements 123 may include preliminary ready components 150, or portions of preliminary ready components 150 including a write module 602, a progress threshold module 604, and an indication module 606, and may use set modules 702 to set different progress thresholds for the different non-volatile memory elements 123. For example, a first non-volatile memory element 123 may set a progress threshold based on a first request received by the first non-volatile memory element 123 from the controller 126, and a second non-volatile memory element 123 may set a second progress threshold based on a different request, received by the second non-volatile memory element 123 from the controller 126.

In some embodiments, using different progress thresholds for different non-volatile memory elements 123 may limit variation or increase uniformity for the elapsed time in the "almost ready" state for different non-volatile memory elements. For example, if one non-volatile memory element 123 processes write operations faster than another non-volatile memory element 123, an earlier progress threshold may be set for the faster non-volatile memory element 123 to equalize (or reduce variation in) the amount of time both non-volatile memory elements 123 spend in the "almost ready" state for a write operation.

The update module 704, in one embodiment, is used by a non-volatile memory element 123 to update a progress threshold for writing further data (e.g., for further or subsequent write operations), based on an elapsed time between providing a preliminary ready indication or sending a preparatory ready signal, and completing a write operation (e.g., by finishing writing the data). Various ways to measure or specify an elapsed time for the almost ready state are described above with regard to FIG. 5. In certain embodiments, the request received by the set module 702 may include a requested elapsed time from the controller 126.

In one embodiment, if the actual elapsed time is less than the requested or otherwise specified elapsed time, the update module 704 may update the progress threshold to provide a longer elapsed time (e.g., a progress threshold based on a number or percentage of programmed storage cells may be updated to be satisfied at a lower number or percentage). In another embodiment, if the actual elapsed time is greater than the requested or otherwise specified elapsed time, the update module 704 may update the progress threshold to provide a shorter elapsed time (e.g., a progress threshold based on an expected count of write pulses for the write operation may be set to be satisfied at a higher count of write pulses). In one embodiment, the update module 704 may update a progress threshold based on an elapsed time in the almost ready state for the most recent completed write operation. In another embodiment, the update module 704 may update a progress threshold based on an average elapsed time in the almost ready state for a set of recently completed write operations Various ways of updating progress thresholds based on elapsed times in the almost ready state will be clear in view of this disclosure.

In a certain embodiment, the set module 702 and the update module 704 may cooperate to satisfy a request that specifies an elapsed time for the almost ready state. For example, the set module 702 may set a progress threshold based on the requested elapsed time, and initiate a training cycle of test writes. The update module 704 may update the progress threshold for the test writes until the training cycle ends based on the elapsed time in the almost ready state for a test write satisfying the request.

In certain embodiments, the progress threshold module 604 determining whether the progress threshold is satisfied may include periodically checking whether the progress threshold is satisfied. The delay module 706 and the loop module 708, in various embodiments, control the timing for when the progress threshold module 604 starts checking whether the progress threshold is satisfied, and how often the progress threshold module 604 checks whether the progress threshold is satisfied.

In one embodiment, a non-volatile memory element 123 may be configured to use a delay module 706, to wait for a predefined number of write pulses to elapse for the write operation, prior to using the progress threshold module 604 to determine whether a progress threshold is satisfied for a write operation. In various embodiments, determining whether a progress threshold is satisfied may interrupt a write operation, or add time to a write operation. For example, verify pulses for checking whether cells satisfy a verify threshold may interrupt a series of write pulses. Thus, waiting a certain number of write pulses before determining whether a progress threshold is satisfied may avoid interruptions in the early stages of a write operation, when the progress threshold is not likely to be satisfied. The number of write pulses for the delay module 706 to wait may be predefined by a user, administrator, or manufacturer of the non-volatile memory element 123, and may be fixed, updatable in response to a request, adjustable based on previous write operations, or the like.

In one embodiment a non-volatile memory element 123 may be configured to use the progress threshold module 604 to re-determine whether the progress threshold is satisfied, in response to a predefined number of write pulses elapsing after the progress threshold module 604 determines that the progress threshold is not satisfied. The loop module 708, in certain embodiments, may wait for the predefined number of write pulses to elapse, and then trigger the progress threshold module 604 to re-determine whether the progress threshold is satisfied. The number of write pulses for the loop module 708 to wait may be independent of the number of write pulses used by the delay module 706. The number of write pulses for the loop module 708 to wait may be predefined by a user, administrator, or manufacturer of the non-volatile memory element 123, and may be fixed, updatable in response to a request, adjustable based on previous write operations, or the like.

In one embodiment, without a delay module 706 or a loop module 708, the progress threshold module 604 may check whether the progress threshold is satisfied after every write pulse. In another embodiment, however, with a delay module 706 and a loop module 708, the progress threshold module 604 may check whether the progress threshold is satisfied after the first N write pulses in a write operation (as controlled by the delay module 706), and after every M write pulses thereafter until the progress threshold is satisfied (as controlled by the loop module 708).

Figure 8:
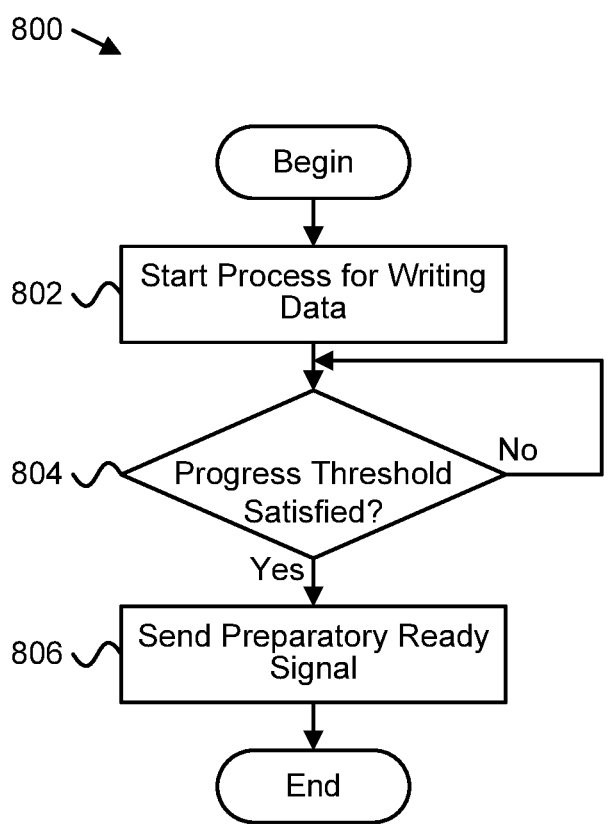
FIG. 8 is a schematic flow chart diagram illustrating one embodiment of a method for providing a preparatory ready signal for non-volatile memory.

FIG. 8 is a schematic flow chart diagram illustrating one embodiment of a method 800 for providing a preparatory ready signal for non-volatile memory. The method 800 begins, and the write module 602 starts 802 a process for writing data to one or more storage cells of a non-volatile memory element 123. The progress threshold module 604 periodically determines 804 whether a progress threshold is satisfied for writing the data, until the progress threshold is satisfied. In response to progress threshold module 604 determining 804 that the progress threshold is satisfied, the indication module 606 sends 806 a preparatory ready signal from the non-volatile memory element 123 to a controller 126, indicating that the progress threshold is satisfied, and the method 800 ends.

Figure 9:
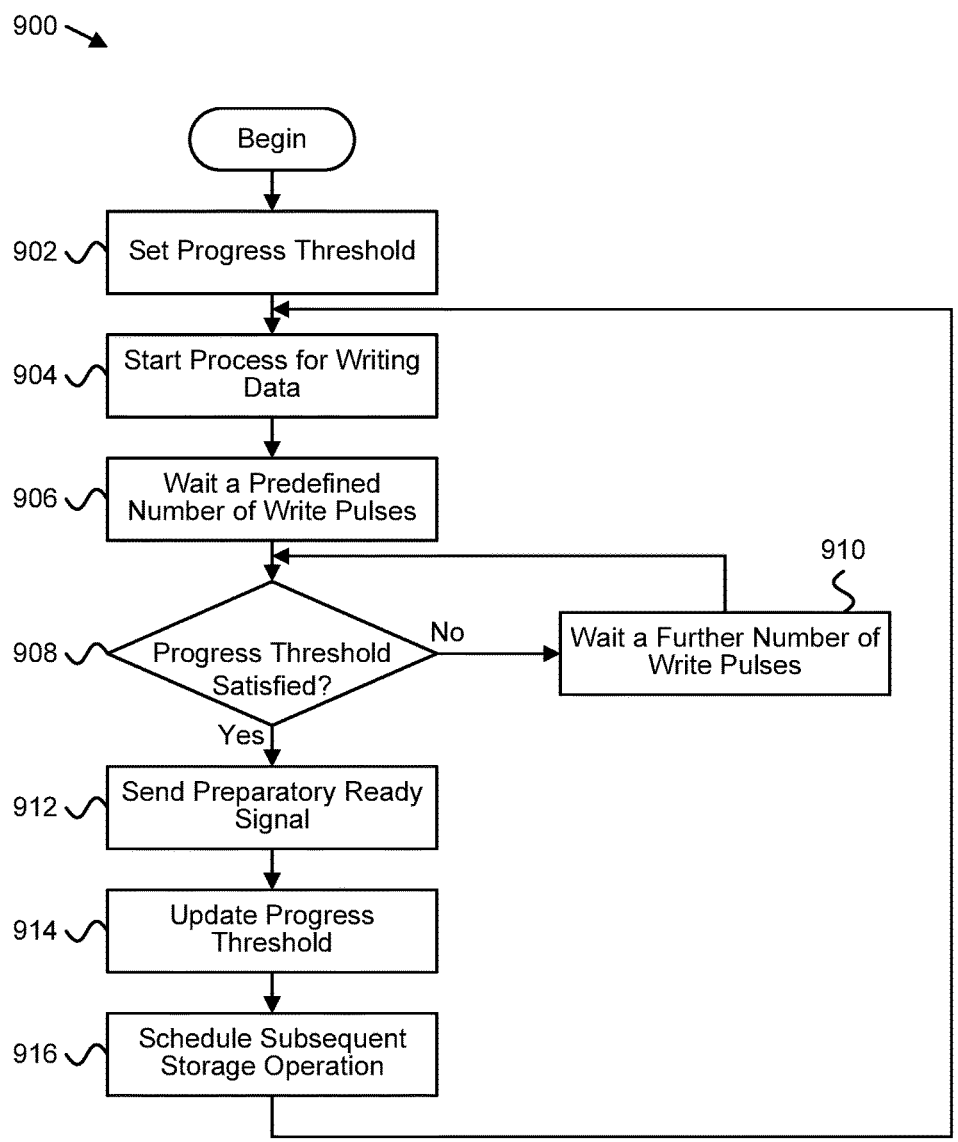
FIG. 9 is a schematic flow chart diagram illustrating a further embodiment of a method for providing a preparatory ready signal for non-volatile memory.

FIG. 9 is a schematic flow chart diagram illustrating a further embodiment of a method 900 for providing a preparatory ready signal for non-volatile memory. The method 900 begins, and the set module 702 sets 902 a progress threshold for a non-volatile memory element 123, based on a request from a controller 126. The write module 602 starts 904 a process for writing data to one or more storage cells of the non-volatile memory element 123. The delay module 706 waits 906 a predefined number of write pulses, and the progress threshold module 604 determines 908 whether the progress threshold is satisfied for writing the data. If the progress threshold is not satisfied, the loop module 708 waits 910 a further number of write pulses, and the progress threshold module 604 re-determines 908 whether the progress threshold is satisfied.

If the progress threshold is satisfied, the indication module 606 sends 912 a preparatory ready signal from the non-volatile memory element 123 to the controller 126. The update module 704 updates 914 the progress threshold for writing further data, based on an elapsed time between sending the preparatory ready signal and finishing writing the data. The schedule module 710 schedules 916 a subsequent storage operation for the non-volatile memory element 123 based on the controller 126 receiving the preparatory ready indication and the method 900 continues with the write module 602 starting 904 a process for writing data of the subsequent storage operation.

A means for initiating a write operation, in various embodiments, may include a write module 602, a preliminary ready component 150, read and write circuits, row and column decoders, a processor, a die controller, a die state machine, a non-volatile memory media controller, a device driver, other logic hardware, and/or other executable code stored on a computer readable storage medium. Other embodiments may include similar or equivalent means for initiating a write operation A means for determining whether a progress threshold is satisfied, in various embodiments, may include a progress threshold module 604, a preliminary ready component 150, read and write circuits, row and column decoders, a processor, a die controller, a die state machine, a non-volatile memory media controller, a device driver, other logic hardware, and/or other executable code stored on a computer readable storage medium. Other embodiments may include similar or equivalent means for determining whether a progress threshold is satisfied.

A means for providing a preliminary ready indication, in various embodiments, may include an indication module 606, a preliminary ready component 150, read and write circuits, a ready/busy pin 306, a die controller, a die state machine, other logic hardware, and/or other executable code stored on a computer readable storage medium. Other embodiments may include similar or equivalent means for providing a preliminary ready indication.

A means for scheduling further programming or subsequent write operations for a non-volatile memory element 123, in various embodiments, may include a schedule module 710, a preliminary ready component 150, a scheduler 302, one or more queues 304, a processor, a die controller, a die state machine, a non-volatile memory media controller, a device driver, other logic hardware, and/or other executable code stored on a computer readable storage medium. Other embodiments may include similar or equivalent means for scheduling further programming.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a non-volatile memory element configured to
      initiate a write operation for one or more storage cells of the non-volatile memory element;
      determine whether a progress threshold is satisfied for the write operation, the progress threshold indicating that less than a number of cells selected for the write operation satisfy a verify threshold; and
      provide a preliminary ready indication, indicating that the progress threshold is satisfied.

2. The apparatus of claim 1, wherein the non-volatile memory element is further configured to update the progress threshold for a subsequent write operation, based on an elapsed time between providing the preliminary ready indication and completing the write operation.

3. The apparatus of claim 1, wherein the write operation comprises an erase operation.

4. The apparatus of claim 1, wherein the progress threshold is based on one or more of:
   a number of storage cells of the non-volatile memory element that satisfy one or more verify thresholds for the write operation including the verify threshold, and
   a count of write pulses for the write operation.

5. The apparatus of claim 1, wherein the non-volatile memory element is further configured to set the progress threshold based on a request received by the non-volatile memory element from a controller, and a second non-volatile memory element is configured to set a second progress threshold based on a second request from the controller.

6. The apparatus of claim 1, wherein the non-volatile memory element is further configured to wait for a predefined number of write pulses to elapse for the write operation, prior to determining whether a progress threshold is satisfied for the write operation.

7. The apparatus of claim 1, wherein the non-volatile memory element is configured to re-determine whether the progress threshold is satisfied, in response to a predefined number of write pulses elapsing after determining that the progress threshold is not satisfied.

8. The apparatus of claim 1, wherein the progress threshold is based on a health characteristic associated with the non-volatile memory element.

9. The apparatus of claim 1, wherein the non-volatile memory element is configured to provide the preliminary ready indication in response to being polled by a controller.

10. The apparatus of claim 1, wherein the non-volatile memory element is configured to provide the preliminary ready indication using an existing ready/busy pin for the non-volatile memory element.

11. An apparatus comprising:
    a non-volatile storage element configured to
       begin programming one or more storage cells of the non-volatile storage element,
       determine whether a progress threshold is satisfied for programming the one or more storage cells, the progress threshold indicating that less than a number of cells selected for programming satisfy a verify threshold, and
       indicate, prior to completing programming of the one or more storage cells, that the progress threshold is satisfied; and
    a controller configured to schedule further programming of the non-volatile storage element based on the non-volatile storage element indicating that the progress threshold is satisfied.

12. The apparatus of claim 11, wherein the non-volatile storage element is further configured to set the progress threshold based on a request sent by the controller, wherein setting the progress threshold comprises one or more of setting an initial progress threshold and updating the progress threshold.

13. The apparatus of claim 12, wherein the request is based on a speed of the controller scheduling the further programming of the non-volatile storage element.

14. The apparatus of claim 12, wherein the request comprises one or more of an in-band request sent by the controller in conjunction with a storage operation request and an out-of-band request sent by the controller independently of storage operation requests sent by the controller.

15. The apparatus of claim 11, wherein the controller comprises a hardware controller for a storage device, the storage device comprising the non-volatile storage element.

16. The apparatus of claim 11, wherein the controller comprises a device driver for a storage device, the storage device comprising the non-volatile storage element, the device driver comprising one or more of logic hardware and executable code, the executable code stored on one or more computer readable storage media.

17. A method comprising:
    starting a process for writing data to one or more storage cells of a non-volatile memory element;
    determining whether a progress threshold is satisfied for writing the data, the progress threshold based on a number of storage cells of the non-volatile memory element that satisfy one or more verify thresholds being less than a number of cells selected for writing the data; and
    sending a preparatory ready signal from the non-volatile memory element to a controller, the preparatory ready signal indicating that the progress threshold is satisfied.

18. The method of claim 17, further comprising scheduling a storage operation for the non-volatile memory element based on the controller receiving the preparatory ready indication.

19. The method of claim 17, further comprising updating the progress threshold for writing further data, based on an elapsed time between sending the preparatory ready signal and finishing writing the data.

20. The method of claim 17, wherein the process for writing data comprises an erase operation and the one or more verify thresholds comprise an erase verify threshold.

* * * * *